United States Patent [19]

MacFall

[11] Patent Number: 4,549,140

[45] Date of Patent: Oct. 22, 1985

[54] METHOD UTILIZING COMBINED, INTERLEAVED PULSE SEQUENCES FOR REDUCING MOTION ARTIFACTS IN COMPUTED $T_1$, $T_2$ AND $M_0$ NMR IMAGING

[75] Inventor: James R. MacFall, Hartland, Wis.

[73] Assignee: General Electric Company, Milwaukee, Wis.

[21] Appl. No.: 500,666

[22] Filed: Jun. 3, 1983

[51] Int. Cl.[4] ............................................. G01R 33/08
[52] U.S. Cl. ................................... 324/309; 324/312; 324/306
[58] Field of Search ............... 324/300, 307, 309, 312, 324/313, 314, 306

[56] References Cited

U.S. PATENT DOCUMENTS

| | | | |
|---|---|---|---|
| 4,300,096 | 11/1981 | Harrison | 324/309 |
| 4,443,760 | 4/1984 | Edelstein | 324/309 |
| 4,471,306 | 9/1984 | Edelstein | 324/309 |
| 4,475,084 | 10/1984 | Moore | 324/309 |
| 4,484,138 | 11/1984 | Bottomley | 324/309 |
| 4,506,222 | 3/1985 | Edelstein | 324/309 |
| 4,516,075 | 5/1985 | Moran | 324/309 |

Primary Examiner—Michael J. Tokar
Attorney, Agent, or Firm—Alexander M. Gerasimow; Douglas E. Stoner

[57] ABSTRACT

A method is provided utilizing combined, interleaved pulse sequences for reducing motion artifacts in computed $T_1$, $T_2$, and $M_0$ (spin density) NMR images. The imaging data is acquired using a repetition of a sequence made up of RF and magnetic-field-gradient pulses. Each repetition of the sequence includes at least two steps of exciting nuclear spins so as to produce a corresponding number of NMR signals. The NMR signals are sampled in the presence of a magnetic-field gradient for encoding spatial information into the NMR signals. Each repetition of the sequence includes at least two different sequence repetition times such that the NMR signals are sampled at approximately the same average time relative to any sample motion.

9 Claims, 7 Drawing Figures

METHOD UTILIZING COMBINED, INTERLEAVED PULSE SEQUENCES FOR REDUCING MOTION ARTIFACTS IN COMPUTED $T_1, T_2$ AND $M_0$ NMR IMAGING

CROSS REFERENCE TO RELATED APPLICATION

This application is related to commonly assigned patent application Ser. No. 500,665, entitled "Method of Accurate and Rapid NMR Imaging of Computed $T_1$ and Spin-Density Parameters" filed by J. R. MacFall and F. W. Wehrli concurrently with the present application.

BACKGROUND OF THE INVENTION

This invention relates to nuclear magnetic resonance (NMR) imaging methods. More specifically, the invention relates to NMR methods utilizing combined, interleaved pulse sequences for reducing motion artifacts in images displaying one or more of the computed spin-lattice ($T_1$), spin-spin ($T_2$) and spin-density ($M_o$) parameters.

By way of background, the nuclear magnetic resonance phenomenon occurs in atomic nuclei having an odd number of protons and/or neutrons. Due to the spin of the protons and the neutrons, each such nucleus exhibits a magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the equation $\omega = \gamma B$, in which $\gamma$ is the gyromagnetic ratio which is constant for each NMR isotope and wherein B is the magnetic field acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of a magnetic field oscillating at the Larmor frequency. Typically, such a magnetic field designated $B_1$ is applied in a plane orthogonal to the direction of the static magnetic field by means of a radio frequency (RF) pulse through coils connected to a radio-frequency-transmitting apparatus. The effect of field $B_1$ is to rotate magnetization M about the direction of the $B_1$ field. This may be best visualized if the motion of magnetization M due to the application of RF pulses is considered in a Cartesian coordinate system which rotates at a frequency substantially equal to the resonant frequency $\omega$ about the main magnetic field $B_o$ in the same direction in which the magnetization M precesses (i.e., the rotating frame). In this case, the $B_o$ field is typically chosen to be directed in the positive direction of the Z-axis, which, in the rotating frame, is designated Z' to distinguish it from the fixed-coordinate system. Similarly, the X- and Y-axes are designated X' and Y'. Bearing this in mind, the effect of an RF pulse, then, is to rotate magnetization M, for example, from its direction along the positive Z' axis toward the transverse plane defined by the X' and Y' axes. An RF pulse having either sufficient magnitude or duration to rotate magnetization M into the transverse plane (i.e., 90° from the direction of the $B_o$ field) is conveniently referred to as a 90° RF pulse. Similarly, if either the magnitude or the duration of an RF pulse is selected to be twice that of a 90° pulse, magnetization M will change direction from the positive Z' axis to the negative Z' axis. This kind of an RF pulse is referred to as a 180° RF pulse, or for obvious reasons, as an inverting pulse. It should be noted that a 90° or a 180° RF pulse will rotate magnetization M through the corresponding number of degrees from any initial direction of magnetization M. It should be further noted that an NMR signal will only be observed if magnetization M has a net transverse component (perpendicular to $B_o$) in the transverse plane. Assuming an initial orientation of magnetization M in the direction of the $B_o$ field, a 90° RF pulse produces maximum net transverse magnetization in the transverse plane since all of the magnetization M is in that plane, while a 180° RF pulse does not produce any transverse magnetization. 180° RF pulses are frequently utilized to produce NMR spin-echo signals.

RF pulses may be selective or nonselective. Selective pulses are typically modulated to have a predetermined frequency content so as to excite nuclear spins situated in preselected regions of the sample having magnetic-field strengths as predicted by the Larmor equation. The selective pulses are applied in the presence of localizing magnetic-field gradients. Nonselective pulses generally affect all of the nuclear spins situated within the field of the RF pulse transmitter coil and are typically applied in the absence of localizing magnetic-field gradients.

There are two exponential time constants associated with longitudinal and transverse magnetizations. The time constants characterize the rate of return to equilibrium of these magnetization components following the application of perturbing RF pulses. The first time constant is referred to as the spin-lattice relaxation time ($T_1$) and is the constant for the longitudinal magnetization to return to its equilibrium value. Spin-spin relaxation time ($T_2$) is the constant for the transverse magnetization to return to its equilibrium value in a perfectly homogeneous field $B_o$. In fields having inhomogeneities, the time constant for transverse magnetization is governed by a constant denoted $t_2^*$, with $T_2^*$ being less than $T_2$.

There remains to be considered the use of magnetic-field gradients to encode spatial information (used to reconstruct images, for example) into NMR signals. Typically, three such gradients are necessary:

$G_x(t) = \delta B_o/\delta x$,
$G_y(t) = \delta B_o/\delta y$, and
$G_z(t) = \delta B_o/\delta z$.

The $G_x$, $G_y$, and $G_z$ gradients are constant throughout the imaging slice, but their magnitudes are typically time dependent. The magnetic fields associated with the gradients are denoted, respectively, $b_x$, $b_y$, and $b_z$, wherein $b_x = G_x(t)x$,
$b_y = G_y(t)y$,
$b_z = G_z(t)z$, within the volume.

In the application of NMR to medical diagnostic imaging of a live human subject, for example, the intensity of each picture element (pixel) of the image is a complex function of the tissue-related NMR parameters of the NMR pulse sequence utilized to gather the imaging information. The tissue-related NMR parameters are the afore-described $T_1$ and $T_2$ relaxation times, as well as the spin density ($M_o$) of the particular nuclear species ($H^1$, $P^{31}$, $C^{13}$, etc.) imaged. The proton ($H^1$) is a typically selected nuclear species for NMR study, due to its abundance in water associated with tissue. The pulse sequence timing parameters of importance for image tissue contrast and intensity are the sequence-repetition time $T_r$ and the NMR spin-echo delay time $T_e$, both of which will be described hereinafter in greater detail.

It is desirable to produce an image in which the intensity of each pixel depends only on $T_1$ or $T_2$ or $M_o$, since such an image would depend only on tissue-related parameters and magnetic-field strength. Hence, such images should be easier to interpret, medically, since the complicated dependence of pixel intensity on, for example, $T_r$, $T_e$, and combinations of $T_1$, $T_2$, and $M_o$ is reduced to a single, linear dependence.

In the past, computed $T_1$ images have been produced utilizing an approximation to calculate the $T_1$ values using signal data derived from scans separated in time. However, it is necessary that the data utilized represent the same tissue position. Since typical times to acquire image data in NMR are on the order of several minutes, physiological processes, such as breathing, cardiac motion, or peristaltic motion can cause motion of tissues between the separate application of the pulse sequences utilized to gather the data, hence, making the calculation inaccurate. It is, therefore, a principal object of the present invention to provide NMR pulse sequences which provide NMR imaging data for reconstructing images with reduced motion artifacts.

SUMMARY OF THE INVENTION

In accordance with the invention, an NMR method is provided for imaging a predetermined region of a sample positioned in a homogeneous magnetic field. In the course of a complete scan to obtain imaging data, the predetermined region is subjected to a plurality of repetitions of a sequence composed of rotating magnetic field and magnetic-field-gradient pulses. Each repetition of the sequence includes at least two steps of exciting nuclear spins in the predetermined region so as to produce a corresponding number of NMR signals. The steps of exciting are separated by a sequence-repetition time $T_r$. The NMR signals are sampled in the presence of at least one magnetic-field gradient for encoding spatial information into the signals. Each repetition of sequence includes at least two different $T_r$ times, such that the NMR signals are sampled at approximately the same average time relative to any motion of the sample.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
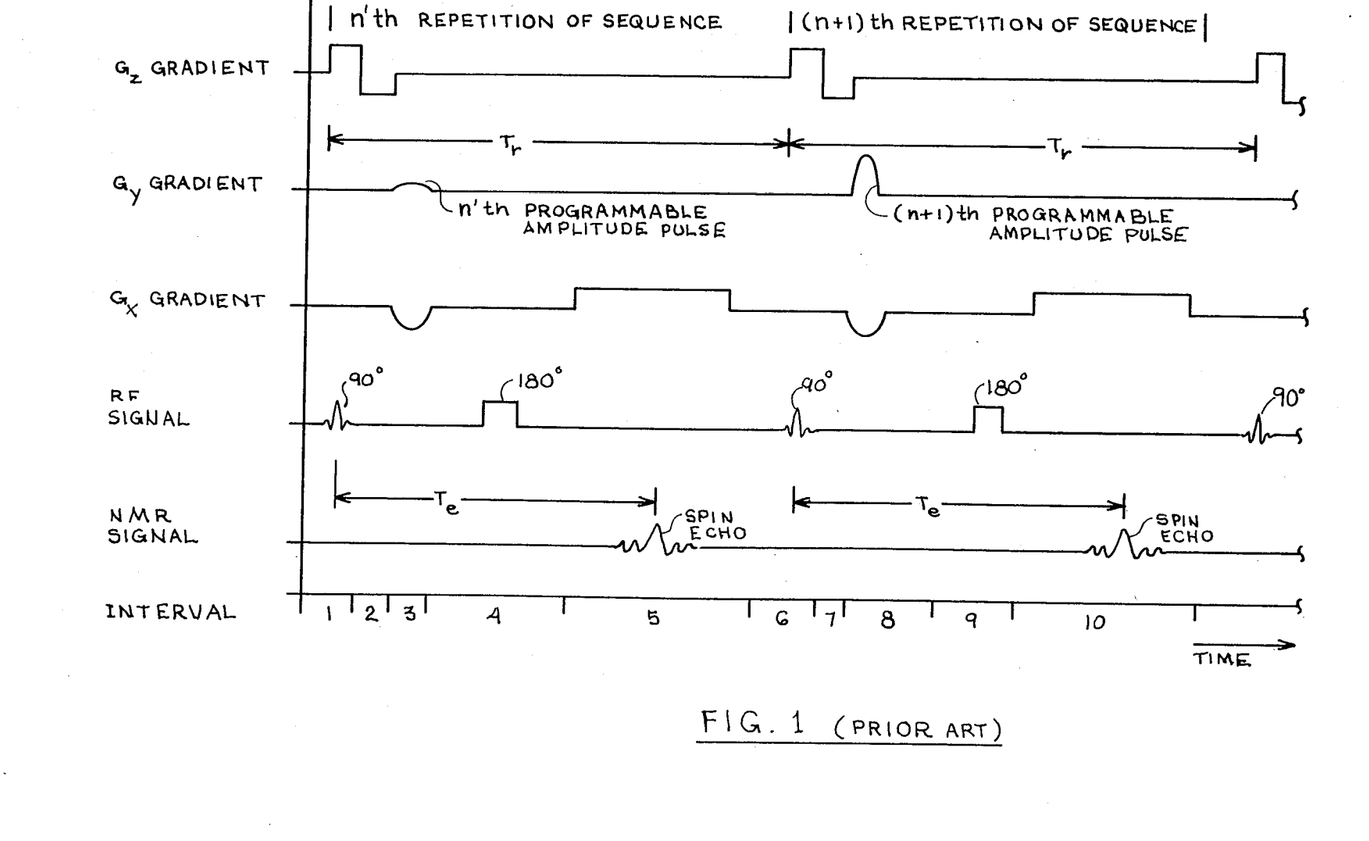
FIG. 1 depicts a conventional NMR pulse sequence utilized in the spin-warp method of imaging.

It will be beneficial to the understanding of the present invention to consider a conventional NMR pulse sequence depicted in FIG. 1. This sequence is the spin-warp version of the two-dimensional Fourier imaging method. The pulse sequence is described, for example, in Kaufman, et al Eds; "Nuclear Magnetic Resonance Imaging in Medicine," Igaku-Shoin Publishers, 1981.

Referring now to FIG. 1, it will be seen that in interval 1, indicated along the horizontal axis, a positive $G_z$ gradient pulse is applied. The direction of the $G_z$ gradient is arbitrarily selected to be in the positive Z-axis direction of the Cartesian coordinate system and coincides with the direction of the $B_o$ magnetic field. The $B_o$ field is not shown in any of the Figures depicting pulse sequences, since it is applied continuously during NMR imaging. Also, in interval 1, a selected 90° RF pulse is applied in the presence of the $G_z$ gradient so as to excite nuclear spins in a predetermined region of a sample (not shown). Typically, the region is selected to be a narrow slice. In the preferred embodiments, the RF pulse is modulated by a sinc function (sin x/x) so as to preferentially excite nuclear spins in an imaging slice having a substantially rectangular profile. When the $G_z$ gradient is turned off, the excited spins precess at the same frequency but are out of phase with one another due to the dephasing effect of the gradient. The nuclear spins are rephased by the application in interval 2 of a negative $G_z$ gradient pulse. Typically, the time integral of the waveform of the $G_z$ gradient over interval 2 required to rephase the spins is approximately equal to the negative one half of the time integral of the positive $G_z$ gradient waveform in interval 1. During interval 3, a phase-encoding $G_y$ gradient is applied simultaneously with the application of a pulsed $G_x$ gradient. The $G_y$ gradient has a single, peak amplitude in the nth repetition of the sequence comprising intervals 1–5. However, in each successive application, such as the (n+1)th repetition of the sequence (e.g., intervals 6–10, FIG. 1), a different amplitude of the phase-encoding gradient is selected. The $G_y$ gradient encodes spatial information in the Y-axis direction by introducing a twist in the orientation of the transverse magnetization by a multiple of $2\pi$ in the Y-axis direction. Following the application of the first phase-encoding gradient, the transverse magnetization is twisted into a one-turn helix. Each different amplitude of the $G_y$ gradient introduces a different degree of twist (phase encoding). The number of $G_y$ gradient amplitudes is chosen to be equal to the number of pixels (typically 128 or 256) the reconstructed image will have in the Y-axis direction.

The effect of the $G_x$ gradient in interval 3 is to dephase the nuclear spins by a predetermined amount such that, when a non-selective 180° RF pulse is applied in interval 4, a spin-echo signal will be produced in interval 5. The time of occurrence of the spin-echo signal is determined by the intensity of the $G_x$ gradient applied in interval 3 and the time the 180° pulse is applied. Spatial information is encoded in the X-axis direction by the application of a linear $G_x$ gradient in interval 5 causing the nuclear spins to resonate at frequencies characteristic of their locations with respect to the X-axis. The spin-echo signal is sampled in interval 7 a number of times which is typically equal to the number of pixels (typically 128 or 256) the reconstructed image will have in the X-axis direction. The image pixel values are obtained from the sample signals using a two-dimensional Fourier transform as disclosed, for example, by Kumar et al in *J. Mag. Res.*, Vol. 18, p. 69 (1975). It will be recognized that spin-echo signals are utilized in the preferred embodiment; however, free induction decay (FID) signals may also be utilized.

The pulse sequence described with reference to FIG. 1 may be used to construct an image in which the intensity of each pixel is a complicated function of various tissue-related NMR parameters, such as, spin-lattice ($T_1$) and spin-spin ($T_2$) relaxation times, and the spin-density ($M_o$) and the pulse sequence timing parameters, such as the sequence-repetition time $T_r$ and the spin-echo time $T_e$. As shown in FIG. 1, the sequence-repetition time is measured between the application of the $G_z$ gradients in intervals 1 and 6 of the nth and (n+1)th repetition of the pulse sequence, respectively. The spin-echo time is measured between the mean application of the selective 90° RF pulse in interval 1, and the mean occurrence of the spin-echo in interval 5 during the nth repetition of the pulse sequence, for example. This sequence is typically repeated enough times (n=128 or 256) to acquire all of the data necessary to construct an image. This repeated sequence is referred to hereinafter as a "scan."

Figure 2:
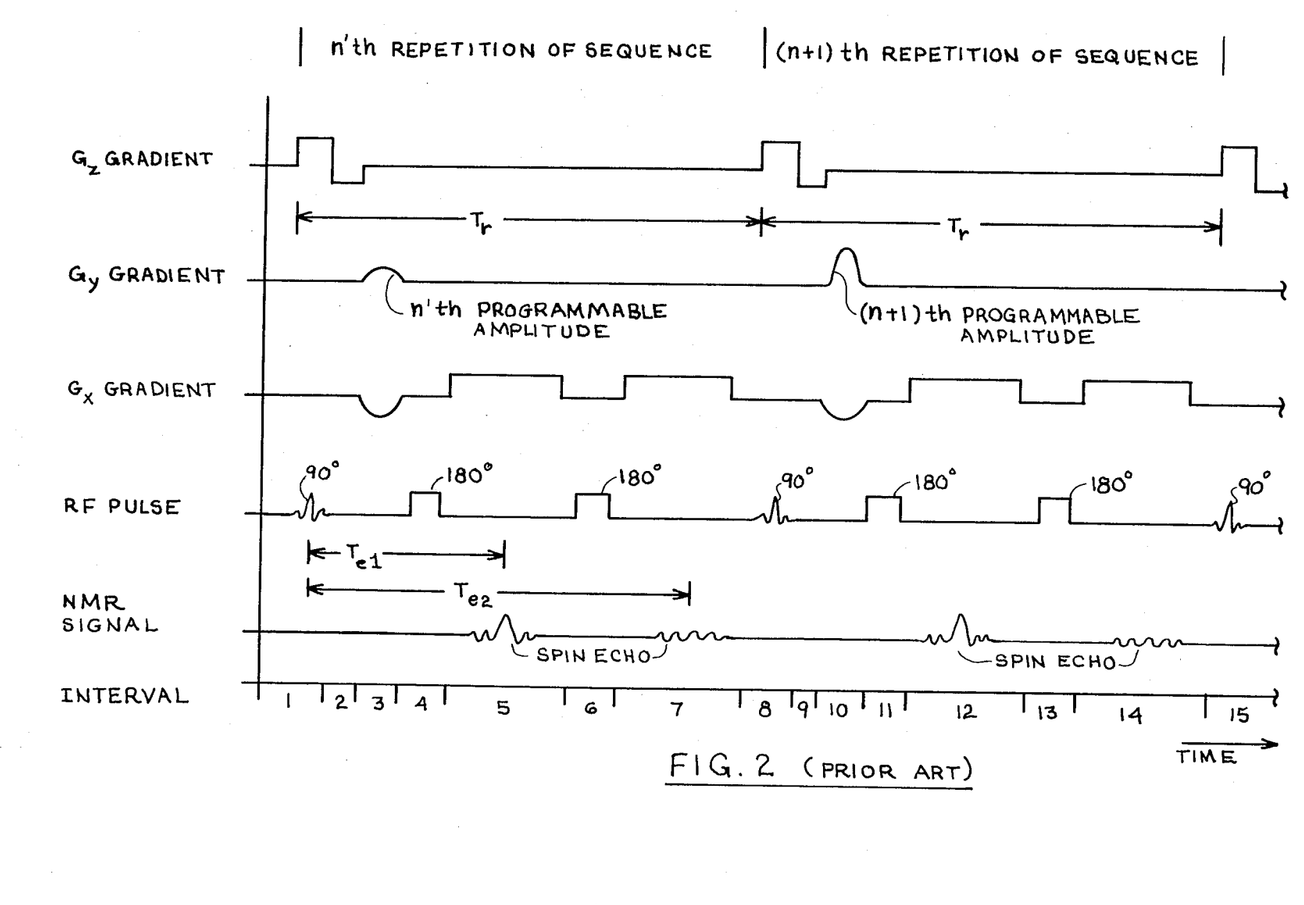
FIG. 2 is a pulse sequence similar to that in FIG. 1 and which is utilized with the methods of the prior art to gather imaging information for constructing computed $T_1$ images.

As described hereinbefore, an image in which the intensity of each pixel depends only on the tissue-related NMR parameters is desirable, since such an image would be easier to interpret. Such images have been produced in the past utilizing, for example, the pulse sequence depicted in FIG. 2 to collect the imaging data. This pulse sequence is substantially identical to that depicted in FIG. 1, but with the exception that additional inverting 180° RF pulses are applied in intervals 6 and 13 of FIG. 2 to produce additional NMR spin-echo signals in intervals 7 and 14, respectively. In accordance with the conventional imaging method, a scan is first performed by selecting the sequence repetition time $T_r$ to be equal to $T_{r1}$. Then, a second scan is performed with $T_r=2T_{r1}$. Each scan produces two images, the first corresponding to the data for a spin-echo signal in interval 5 at $T_e=T_{e1}$, and the second image for the spin-echo signal in interval 7 at $T_e=T_{e2}$. If $I_{11}$ is the intensity of a pixel in the first image from the first scan, and $I_{12}$ is the intensity of the corresponding pixel from the first image of the second scan, then it can be shown that to an approximation:

$$T_1 = -T_{r1}/\ln\left(\frac{I_{12}}{I_{11}} - 1\right), \quad (1)$$

which is true if $T_r$ is much greater than $T_{e1}$ and $T_{e2}$.

It is apparent that Equation (1) can be used to create a computed $T_1$ image by setting the intensity of the corresponding pixel in the computed $T_1$ image in proportion to the approximate $T_1$ value calculated. In this conventional approach for producing computed $T_1$ images, the two intensities $I_{11}$ and $I_{12}$ are derived from scans separated in time. That is, as described hereinabove, a first scan is performed with a sequence-repetition time $T_{r1}$ and then upon the completion of the first scan, a second scan is performed with a sequence repetition time set to $2T_{r1}$. A drawback associated with this technique is that the approximation of Equation (1) requires that the intensities $I_{11}$ and $I_{12}$ represent the same tissue positions. This is a difficult condition to achieve since several minutes are typically required to acquire the NMR image data. During the data-acquisition time, processes, such as cardiac motion, breathing, or peristaltic motion, can cause movement of tissues between the separate scans.

Figure 3:
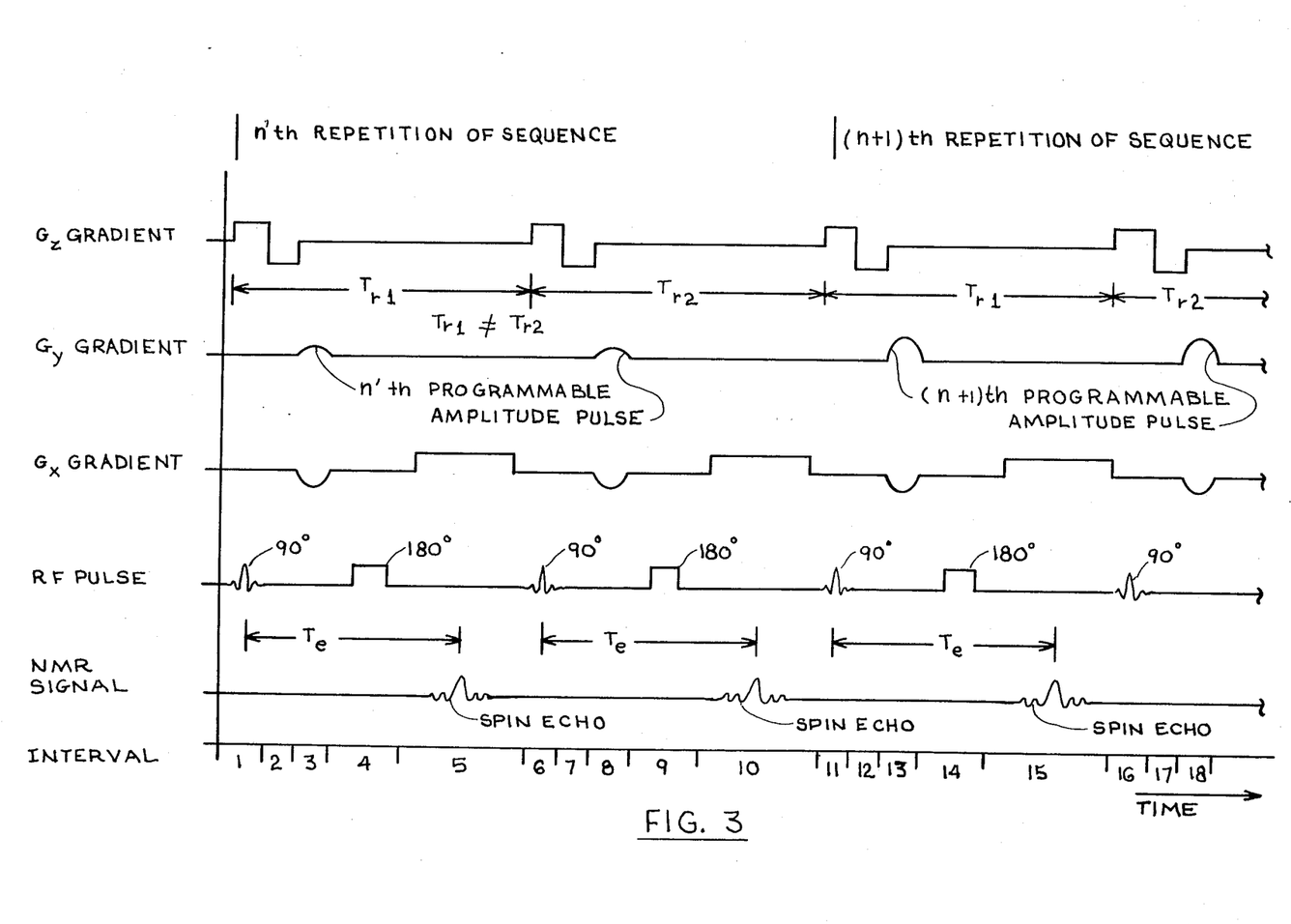
FIG. 3 depicts one exemplary embodiment of an interleaved pulse sequence in accordance with the invention for $T_1$ determination.

In accordance with the present invention, the problem of tissue motion between scans is solved by the implementation of the pulse sequence depicted in FIG. 3. Taken individually, portions of the pulse sequence depicted in FIG. 3 (e.g., intervals 1–5, 6–10, 11–15, etc.) are similar to those of the conventional spin-warp sequence described hereinbefore with reference to FIG. 1. The manner in which the inventive pulse sequence is implemented to collect NMR imaging data is, however, substantially different. Using the inventive pulse sequence, a single scan is performed using the pulse sequence to acquire data for $T_r=T_{r1}$ and for $T_r=T_{r2}$ sequentially, very close in time.

Referring now to FIG. 3, it will be seen that in the nth repetition of the sequence a spin-echo signal is observed in interval 5 which is the result of a sequence-repetition time $T_{r1}$. As part of the nth repetition of the sequence, a second spin-echo signal is observed in interval 10 for a sequence-repetition time $T_{r2}$ which is selected to be different from the time $T_{r1}$. During the (n+1)th repetition of the sequence, the amplitude of the programmable phase-encoding $G_y$ gradient applied in intervals 13 and 18 is sequenced to its next value. Two spin-echo signals are again observed for the sequence-repetition times $T_{r1}$ and $T_{r2}$. For the (n+1)th repetition, only the spin-echo signal occurring in interval 15 associated with the sequence-repetition time $T_{r1}$ is shown. The pulse sequence is repeated n times (to sequence through all amplitudes of gradient $G_y$), and two spin-echo signals associated with the $T_{r1}$ and $T_{r2}$ repetition times are observed for each repetition. Two images are to be constructed from the scan, where the signals acquired at $T_r=T_{r1}$ (e.g., intervals 5 and 15) form one image, and the signals from $T_r=T_{r2}$ (interval 10) form the second image. Since the data is acquired in an interleaved fashion, alternating the values of $T_r$ between $T_{r1}$ and $T_{r2}$, the two images produced from the scan will be acquired at nearly the same average time (usually differing only by a few milliseconds) relative to tissue motion. In this manner, tissue motion will be zero or negligible.

A $T_1$ image with reduced motion artifacts can be computed using the data collected with the inventive pulse sequence in the manner described above using the approximate Equation (1) and setting $T_{r2}=2T_{r1}$. A more accurate relation between $T_1$ and the timing parameters is $$\frac{I_1}{I_2} = \frac{(1 - 2e^{-(Tr1-Te/2)/T1} + e^{-Tr1/T1})}{(1 - 2e^{-(Tr2-Te/2)/T1} + e^{-Tr2/T1})} \quad (2)$$

where
- $I_1$ is the intensity of a pixel in the first image using the spin-echo signal information of interval 5, FIG. 3, and
- $I_2$ is the corresponding pixel in the second image constructed using the spin-echo signal of interval 10.

Equation (2) may be solved for other values of $T_{r1}$ and $T_{r2}$ (i.e., when $T_{r2}$ does not equal $2T_{r1}$) using conventional numerical techniques, such as chi-square minimization.

Figure 4:
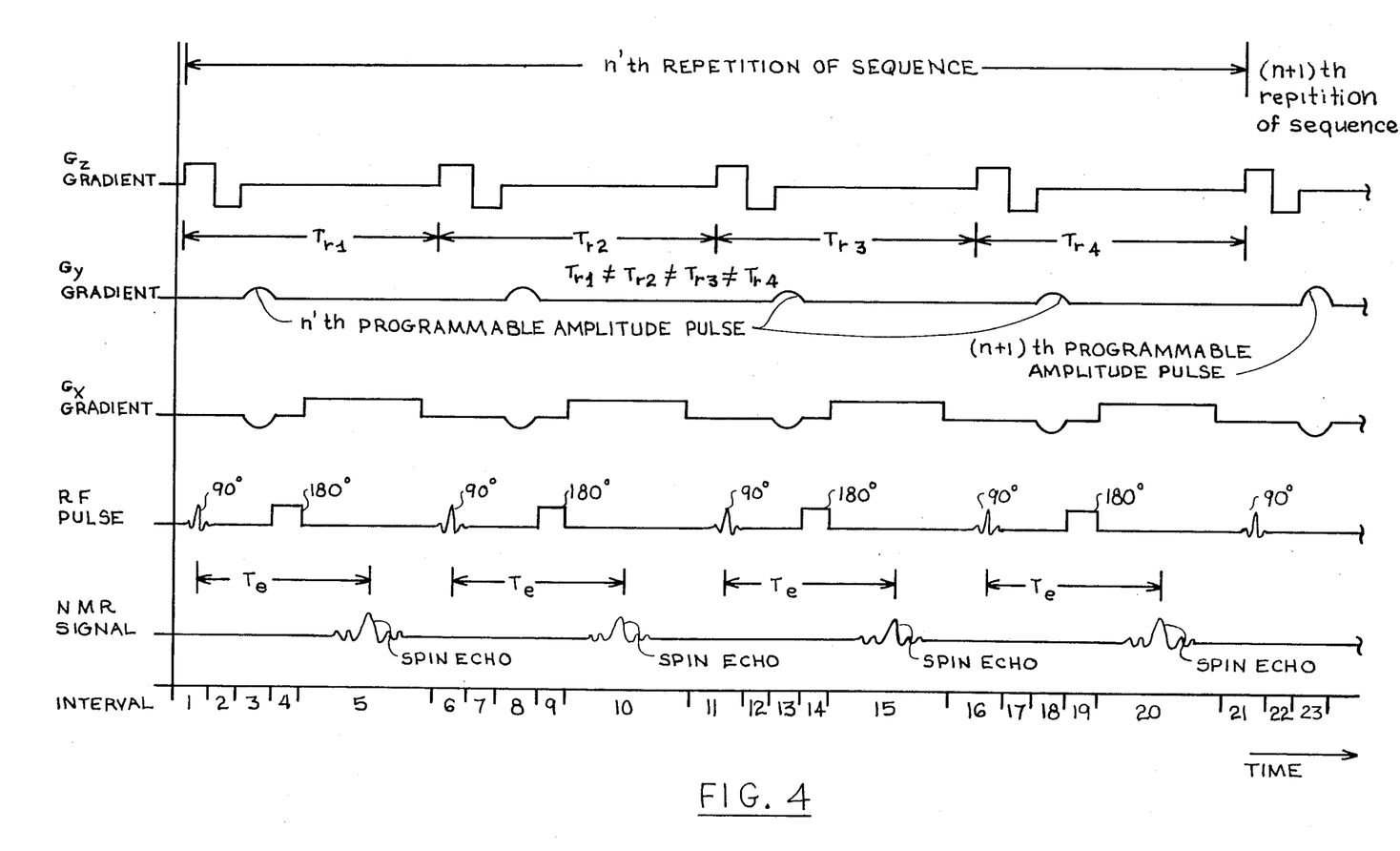
FIG. 4 illustrates another exemplary embodiment of the inventive NMR pulse sequence implemented for four repetition times for determining $T_1$.

The inventive pulse sequence utilizing interleaved sequence-repetition times can be extended to other implementations. FIG. 4 depicts another exemplary embodiment of the invention in which during the nth repetition of a sequence four different sequence-repetition times $T_{r1}$, $T_{r2}$, $T_{r3}$, and $T_{r4}$ are used. Of course, fewer or more repetition times may be selected. For each sequence-repetition time, a corresponding spin-echo signal is observed in intervals 5, 10, 15, and 20, at a spin-echo time $T_e$ following the mean application of the 90° RF pulse. Four images are produced from a single scan (since there are four spin-echo signals) from which a value of $T_1$ for each pixel can be computed using four intensity values. An advantage of acquiring more data points is that the range of accurate calculation, e.g., of $T_1$, is extended, and the accuracy of individual $T_1$'s is improved. The order of the repetition times within a sequence is not important over a range of sequence-repetition times $T_r$ between 100 msec. and 1000 msec. The number of repetition times has been selected to equal four for illustration only. The number may be larger or smaller.

Figure 5:
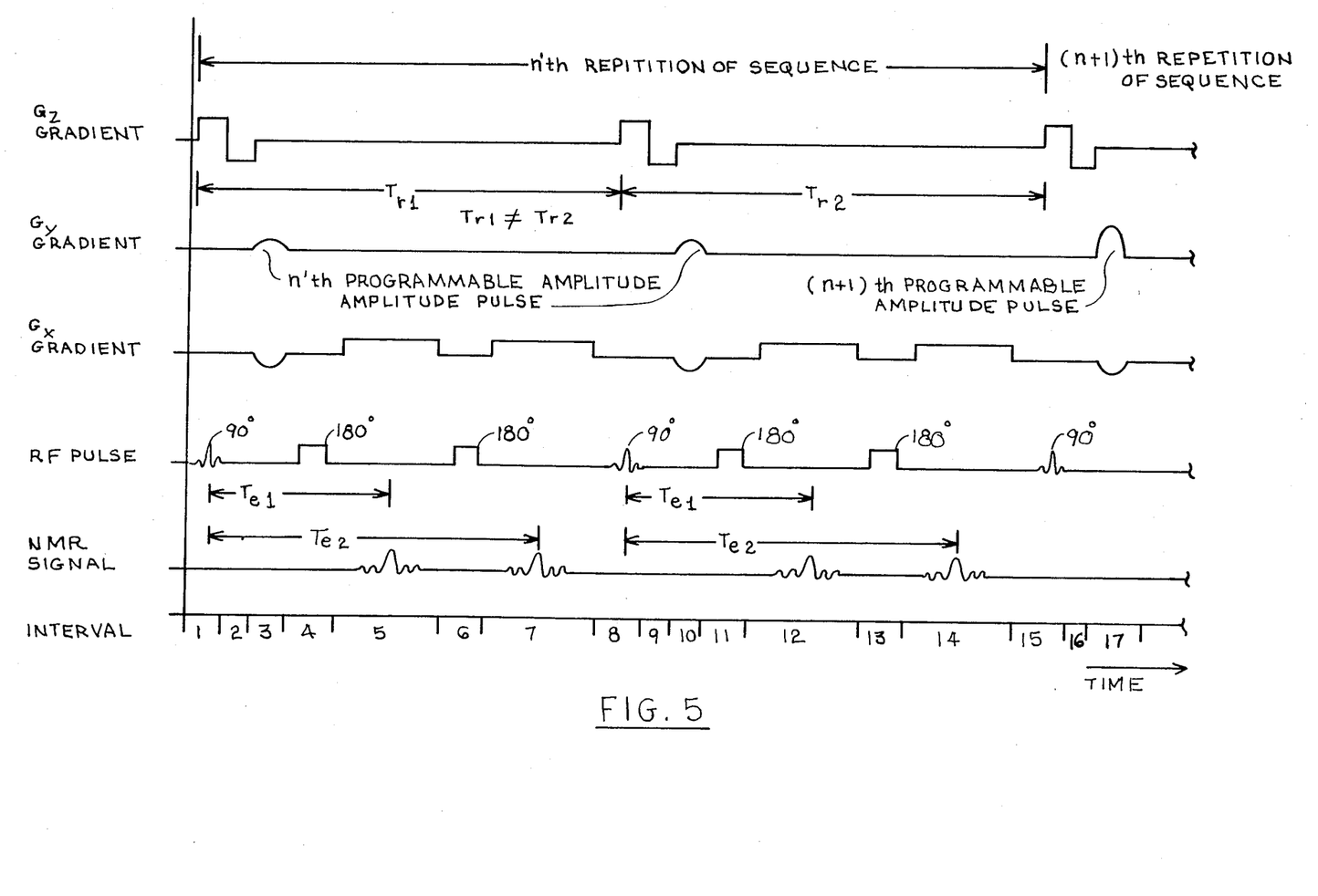
FIG. 5 is as yet another exemplary embodiment of the inventive NMR pulse sequence implemented in combination with multiple spin echoes for simultaneous $T_1$, $T_2$, and $M_o$ determination.

FIG. 5 depicts still another embodiment of the inventive NMR pulse sequence including multiple spin-echo generation to create a combined pulse sequence that produces data for computed $T_1$, computed $T_2$, and computed $M_o$ images from a single scan. For instance, during the nth repetition of the sequence, two sequence-repetition times $T_{r1}$ and $T_{r2}$ are utilized. Additionally, for each sequence-repetition time, two 180° RF pulses are utilized in intervals 4 and 6 so as to produce corresponding spin-echo signals in intervals 5 and 7 at spin-echo delay times $T_{e1}$ and $T_{e2}$, respectively, following the mean application of the 90° RF pulse in interval 1. Similarly, sequence-repetition time $T_{r2}$, spin-echo signals are observed in intervals 12 and 14 resulting from the application of 180° RF pulses in intervals 11 and 13. Hence, for the pulse sequence of FIG. 5, four images are produced. The parameters utilized for each image are as follows:

Image 1 $T_r=T_{r1}$, $T_e=T_{e1}$, pixel intensity $=I_{11}$
Image 2 $T_r=T_{r1}$, $T_e=T_{e2}$, pixel intensity $=I_{12}$
Image 3 $T_r=T_{r2}$, $T_e=T_{e1}$, pixel intensity $=I_{21}$
Image 4 $T_r=T_{r2}$, $T_e=T_{e2}$, pixel intensity $=I_{22}$ Computed $T_1$, $T_2$ and/or $M_o$ images utilizing the data obtained with the inventive NMR pulse sequence can be produced using the approximate equations in which it is assumed that $T_{r2}$ is equal to $2T_{r1}$. These equations are as follows:

$$T_1 = -T_{r1}/\ln\left(\frac{I_{12}}{I_{11}} - 1\right) \quad (3)$$

$$T_2 = (T_{e2} - T_{e1})/\ln\left(\frac{I_{11}}{I_{12}}\right) \quad (4)$$

$$AM_o = \frac{I_{11}}{e^{-Te1/T2}(1 - e^{-Tr1/T1})}, \quad (5)$$

where, in Equation 5, "A" is a scale factor used to convert signal information to spin density. The factor depends on various system electronic gains. Hence, $M_o$ is obtained in relative units but may be determined in terms of density by appropriate calibration. Alternatively, for arbitrary values of $T_{r1}$ and $T_{r2}$, the exact equations stated below can be solved numerically using conventional techniques, such as multi-parameter chi-square minimization.

$$I_{11} = AM_oe^{Te1/T2}(1 - 2e^{-(Tr1-Te1/2)/T1} + e^{-Tr1/T1}) \quad (6)$$
$$I_{12} = AM_oe^{Te2/T2}(1 - 2e^{-(Tr1-Te2/2)/T1} + e^{-Tr1/T1}) \quad (7)$$
$$I_{21} = AM_oe^{-Te1/T2}(1 - 2e^{-(Tr2-Te1/2)/T1} + e^{-Tr2/T1}) \quad (8)$$
$$I_{22} = AM_oe^{-Te2/T2}(1 - 2e^{-(Tr2-Te2/2)/T1} + e^{-Tr2/T1}) \quad (9)$$

Figure 6:
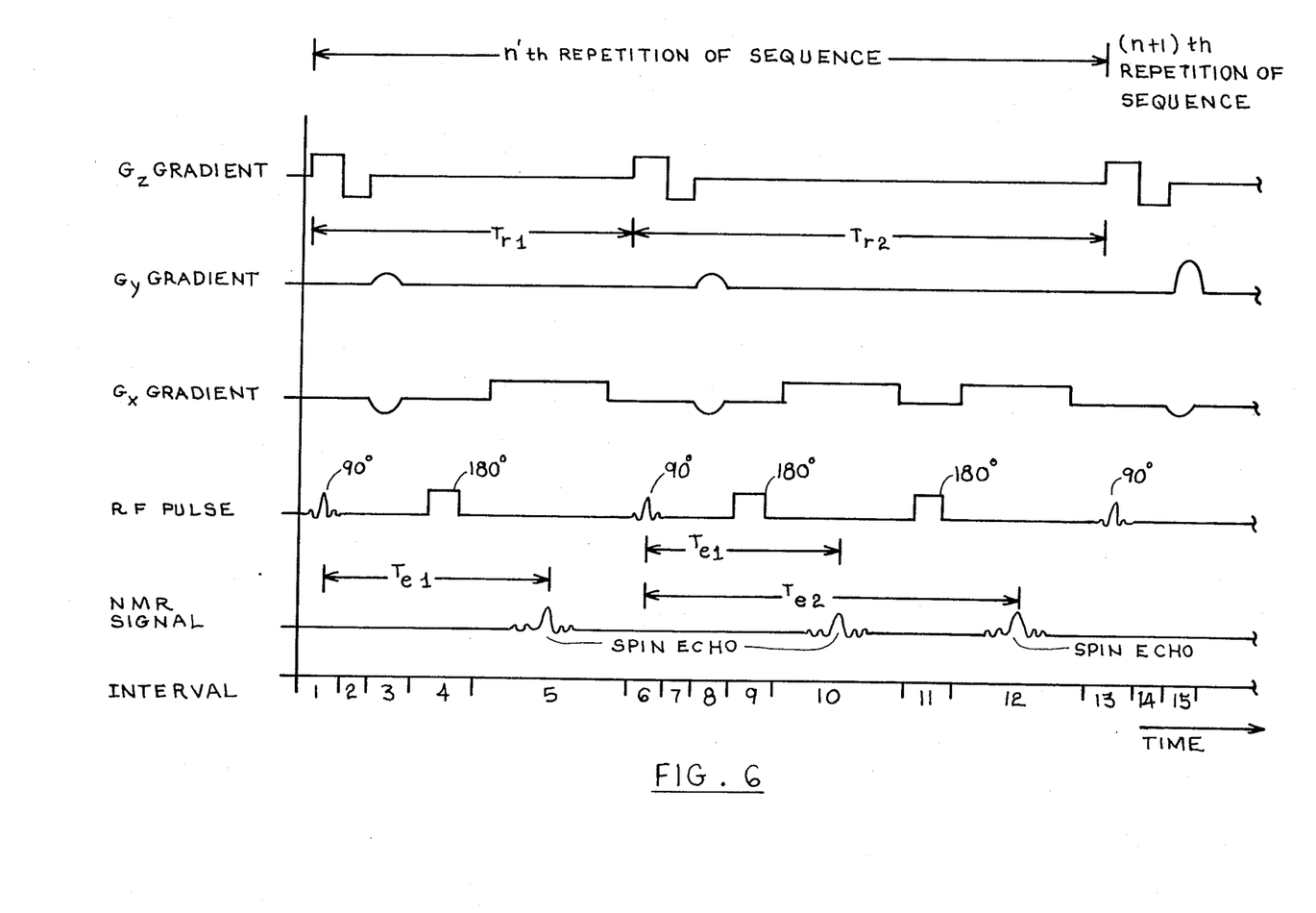
FIG. 6 depicts a pulse sequence similar to that in FIG. 5 and which is also used for simultaneous determination of $T_1$, $T_2$ and $M_o$ values.

Without departing from the spirit of the invention, the pulse sequences can be expanded to include more spin-echo signals and/or more sequence-repetition times to produce increased data for greater accuracy of the computed $T_1$, $T_2$, and/or $M_o$. For example, it is not necessary for each sequence-repetition time to have multiple spin echoes. Referring to FIG. 6, during the nth repetition of the pulse sequence, two different sequence-repetition times $T_{r1}$ and $T_{r2}$ are utilized. It will be noted, for example, that with respect to the sequence-repetition time $T_{r1}$, only a single spin-echo signal is observed in interval 5 at a time $T_{e1}$ following the application of the 90° RF pulse in interval 1. However, two spin-echo signals are observed in intervals 10 and 12 for the portion of the sequence utilizing the $T_{r2}$ sequence-repetition time. These spin-echo signals are observed at a spin-echo time $T_{e1}$ and $T_{e2}$ following the mean application of the 90° RF pulse in interval 6. Spin-echo delay time $T_{e1}$ of the spin-echo signal observed in interval 5 is the same as that of the spin-echo signal observed in interval 10, although the sequence-repetition times are different.

If, as before, an assumption is made that $T_{r2}$ is equal to $2T_{r1}$, then an approximate value for $T_1$ can be calculated using data collected with the sequence of FIG. 6 using the equation:

$$T_1 = -T_{r1}/\ln\left(\frac{I_1}{I_{21}} - 1\right). \quad (10)$$

Similarly, computed values for $T_2$ and $M_o$ may be obtained using the equations:

$$T_2 = (T_{e2} - T_{e1})/\ln\left(\frac{I_{21}}{I_{22}}\right) \quad (11)$$

-continued $$AM_o = \frac{I_1}{e^{-T_{e1}/T_2}(1 - e^{-T_{r1}/T_1})}$$  (12)

It will be recognized that, with the sequence of FIG. 6, the number of single spin-echo signals with different sequence-repetition times could be greater than two, and the number of echoes in the multi-spin-echo portions of the pulse sequence could also be greater than two. This will give increased accuracy of computed values. As before, in the case of arbitrary values of $T_{r2}$ and $T_{r1}$ various numerical techniques known to those skilled in the art can be used to calculate the values of $T_1$, $T_2$, and $M_o$ from more accurate equations similar to Equations (6)–(9).

The preferred embodiments of the invention have been described hereinabove with reference to the spin-warp-imaging technique. It will be recognized, however, by those of ordinary skill in the art that the invention may be advantageously practiced with other pulse sequences. One example of such a pulse sequence is the multiple-angle-projection-reconstruction pulse sequence depicted in FIG. 7 which is similar in many respects to that of FIG. 3. As in FIG. 3, a single scan is performed with the sequence of FIG. 7 to acquire data for, in this case, two sequence-repetition times $T_{r1}$ and $T_{r2}$ during each repetition of the pulse sequence. The spin-echo signals observed in intervals 4 and 8 during the nth repetition of the sequence, for example, at echo-delay times $T_e$ following the mean application of the 90° RF pulses in intervals 1 and 5, respectively, are used to construct two images. As before, since the data is acquired in an interleaved fashion, alternating various values of sequence-repetition time $T_r$, the two images produced from the scan will be acquired at nearly the same average time relative to tissue motion, so that the motion of tissues will be zero or negligible.

Figure 7:
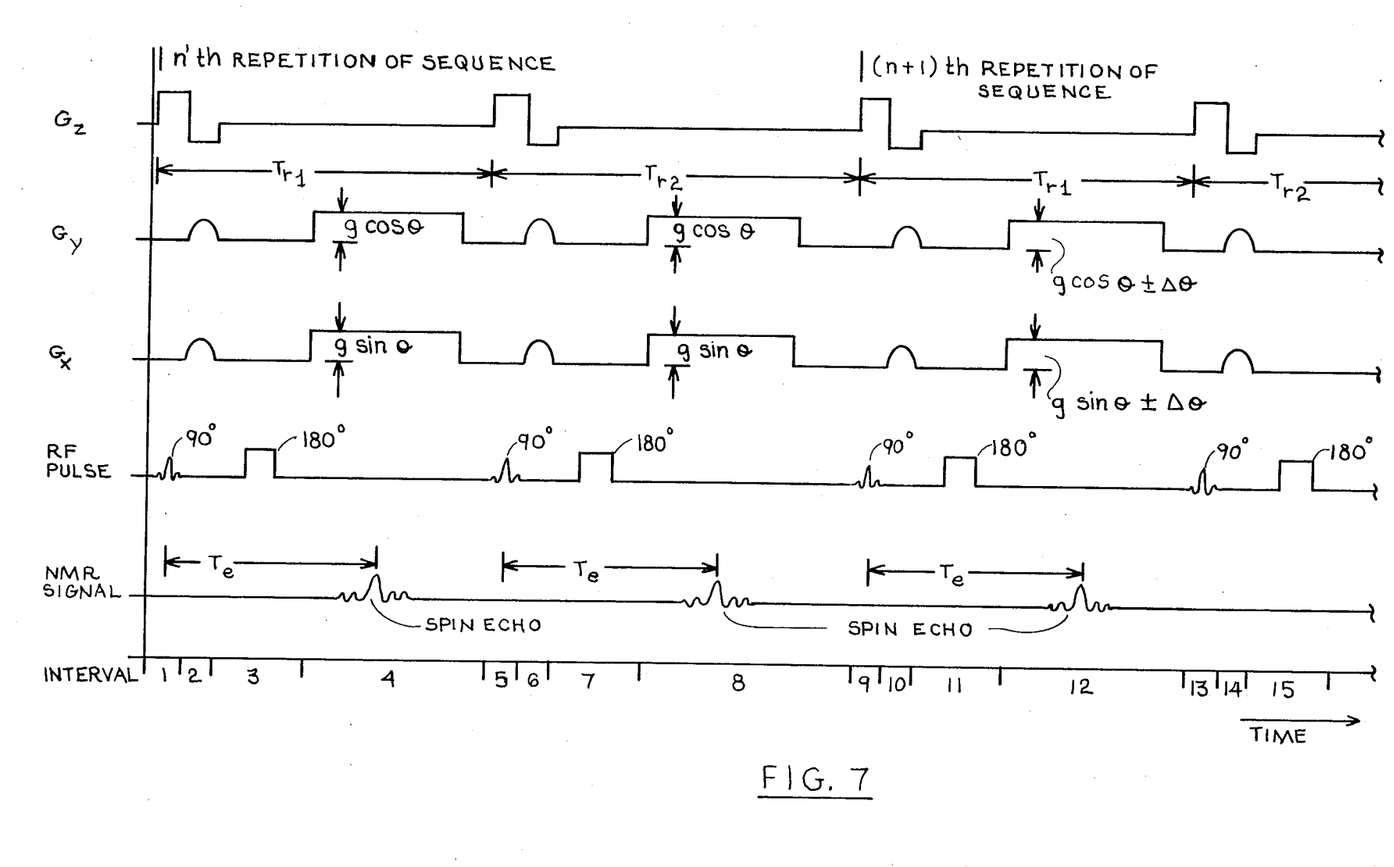
FIG. 7 depicts still another exemplary embodiment of the invention using the technique of multiple-projection reconstruction to encode spatial information into the NMR signals.

The primary difference between the pulse sequence of FIG. 7 and that of FIG. 3 is in the manner in which spatial information is encoded into the spin-echo signals. This difference will be described in an exemplary manner with reference to the spin-echo signal observed in interval 4. The description is, however, equally applicable to the spin-echo signals observed in intervals 8 and 12. It should be initially noted that the $G_y$ gradient applied in interval 2 is not a phase-encoding gradient but is, rather, a gradient pulse used in combination with the positive $G_x$ gradient pulse also in interval 2 to time the occurrence of the spin-echo signal in interval 4. To encode spatial information into the spin-echo signal, linear $G_y$ and $G_x$ gradients are applied during interval 4. The $G_x$ and $G_y$ gradients are directed, respectively, in the X- and Y-axis directions within the imaging slice. The magnitudes of the $G_x$ and $G_y$ gradients in interval 4 determine the projection angle $\theta$. The magnitude of the $G_x$ gradient is made proportional to the sine of the projection angle, while the magnitude of the $G_y$ gradient is made proportional to the cosine of the projection angle. The $G_x$ and $G_y$ gradients add vectorially to produce a resultant gradient in the imaging plane at a directon O. Nuclear spins situated along the direction of the resultant gradient experience different magnetic fields and, therefore, resonate at different frequencies which may be ascertained in a well-known manner by Fourier transformation of the spin-echo signals. Fourier transformation of the signal yields the magnitude of the signal at each frequency and, therefore, at each location with respect to the direction of the gradient. The nuclei situated along each line perpendicular to the direction of the gradient have the same resonant frequency. In successive applications (such as the [n+1]th repetition of the sequence), as is necessary in order to obtain sufficient information to image an entire slice, multiple projections are obtained by changing projection angle $\theta$ by an amount $\Delta\theta$, typically of the order of 1°, to collect spatial information from 180 projections in at least a 180° arc.

It will be recognized that the pulse sequence depicted in FIG. 7 is the simplest embodiment of the invention utilizing the multiple-angle-projection-reconstruction technique. This pulse sequence can be modified in the manner previously described with reference to FIG. 4 to collect data for more than two sequence-repetition times $T_r$. Without limiting the number or types of modifications which may be made, the pulse sequence of FIG. 7 may additionally be modified in the manner previously described with reference to FIGS. 5 and 6 which utilize single and multiple spin-echo signals within each repetition of the sequence to create a combined sequences that produce sufficient data for computed $T_1$, computed $T_2$, and computed $M_o$ images from a single scan.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. An NMR method of imaging a predetermined region of a sample positioned in a homogeneous magnetic field, which method comprises:

subjecting said predetermined region, in the course of a complete scan to obtain imaging data to image said region, to a plurality of repetitions of a sequence composed of rotating magnetic field and magnetic-field-gradient pulses, each repetition of said sequence including at least two steps of exciting nuclear spins in said region so as to produce a corresponding number of NMR signals, said steps of exciting being separated by a sequence repetition time $T_r$; and sampling each of said NMR signals in the presence of at least one magnetic-field gradient for encoding spatial information into said NMR signals to obtain said imaging data, wherein each repetition of said sequence includes at least two different $T_r$ times, such that said NMR signals are sampled at approximately the same average time relative to any motion of said sample.

2. The method of claim 1 wherein said steps of exciting each comprise subjecting said predetermined region in the presence of a magnetic-field gradient to a magnetic field rotating at substantially the Larmor frequency so as to preferentially excite nuclear spins in said region, said NMR signals occurring at a time $T_e$ measured between the mean application of said rotating magnetic field and the mean occurrence of said NMR signal.

3. The method of claim 2 wherein said rotating magnetic field comprises a selective 90° RF pulse.

4. The method of claim 2 wherein said step of exciting further comprises the step of producing at least one spin-echo signal within each sequence-repetition time $T_r$, each spin-echo signal occurring at a different time $T_e$.

5. The method of claim 4 wherein said step of producing a spin-echo signal comprises irradiating said region with a 180° RF pulse.

6. The method of claim 5 wherein said magnetic-field gradient for encoding spatial information is selected to have one of a plurality of directions within said predetermined region for each repetition of said sequence.

7. The method of claim 6 wherein said gradient for encoding spatial information comprises a resultant magnetic-field gradient of the vectorial addition of at least two magnetic-field gradients, which gradients are perpendicular to one another within said predetermined region.

8. The method of claim 5 further comprising the step of applying a variable amplitude magnetic-field gradient having one of a plurality of programmable amplitudes for each repetition of said sequence to encode spatial information into said NMR signals.

9. The method of claim 8 wherein said NMR signals are sampled in the presence of a substantially linear magnetic-field gradient, which gradient is perpendicular to the direction of said variable amplitude gradient within said predetermined region.

* * * * *

UNITED STATES PATENT AND TRADEMARK OFFICE
CERTIFICATE OF CORRECTION

PATENT NO. : 4,549,140
DATED : Oct. 22, 1985
INVENTOR(S) : James R. MacFall

It is certified that error appears in the above-identified patent and that said Letters Patent is hereby corrected as shown below:

Column 2, line 46, change "$t_2^*$" to --$T_2^*$--.

Column 3, line 48, change "on" to --one--.

Column 8, line 25, Equation (6), first occurrence, change "$T_{e1}$" to -- $-T_{e1}$--.

line 26, Equation (7), first occurrence, change "$T_{e2}$" to -- $-T_{e1}$--.

Column 10, line 22, change "sequences" to --sequence--.

Signed and Sealed this

Fourth Day of November, 1986

[SEAL]

*Attest:*

*Attesting Officer*

DONALD J. QUIGG

*Commissioner of Patents and Trademarks*